(12) United States Patent  (10) Patent No.: US 8,216,419 B2
Moshtagh et al.  (45) Date of Patent: Jul. 10, 2012

(54) DRILLED CVD SHOWER HEAD

(75) Inventors: Vahid S. Moshtagh, San Jose, CA (US); Jeffrey C. Ramer, Sunnyvale, CA (US)

(73) Assignee: Bridgelux, Inc., Livermore, CA (US)

( * ) Notice: Subject to any disclaimer, the term of this patent is extended or adjusted under 35 U.S.C. 154(b) by 510 days.

(21) Appl. No.: 12/165,269

(22) Filed: Jun. 30, 2008

(65) Prior Publication Data

US 2009/0241833 A1 Oct. 1, 2009

Related U.S. Application Data (63) Continuation-in-part of application No. 12/058,380, filed on Mar. 28, 2008.

(60) Provisional application No. 61/040,399, filed on Mar. 28, 2008.

(51) Int. Cl.
*C23F 1/00* (2006.01)
*H01L 21/306* (2006.01)
*C23C 16/00* (2006.01)

(52) U.S. Cl. .................. 156/345.34; 118/715

(58) Field of Classification Search ............. 156/345.34; 118/715
See application file for complete search history.

(56) References Cited

U.S. PATENT DOCUMENTS

| | | | |
|---|---|---|---|
| 3,757,733 A | 9/1973 | Reinberg | |
| 4,798,166 A | 1/1989 | Hirooka et al. | |
| 4,812,331 A | 3/1989 | Hirooka et al. | |
| 4,961,399 A | 10/1990 | Frijlink | |
| 4,980,204 A | 12/1990 | Fujii et al. | |
| 5,027,746 A | 7/1991 | Frijlink | |
| 5,281,295 A | 1/1994 | Maeda et al. | |
| 5,334,277 A | 8/1994 | Nakamura | |
| 5,453,124 A | 9/1995 | Moslehi et al. | |
| 5,458,724 A | 10/1995 | Syverson et al. | |
| 5,496,408 A | 3/1996 | Motoda | |
| 5,595,606 A | 1/1997 | Fujikawa et al. | |
| 5,596,606 A | 1/1997 | Montreuil | |
| 5,653,808 A | 8/1997 | MacLeish et al. | |
| 5,788,777 A | 8/1998 | Burk | |
| 5,976,260 A | 11/1999 | Kinoshita | |
| 5,976,261 A | 11/1999 | Moslehi | |
| 6,080,241 A | 6/2000 | Li | |

(Continued)

FOREIGN PATENT DOCUMENTS

JP 62211914 9/1987

(Continued)

OTHER PUBLICATIONS

H. Jurgensen, et al., "MOCVD Equipment for Recent Developments Towards the Blue and Green Solid State Laser", MRS Internet Journal of Nitride Semiconductor Research, vol. 1, Article 26, 1996.

(Continued)

*Primary Examiner* — Keath Chen (57) ABSTRACT

A shower head for a chemical vapor deposition chamber can comprise a plurality of first injectors for a first reactant gas and a plurality of second injectors for a second reactant gas. The first and second injectors can be interspersed among one another so as to enhance control of the mixing and delivery of reactant gases within the chemical deposition chamber. Cooling water can be communicated through a plurality of gun drilled bores formed intermediate injectors of the shower head. In this manner, enhanced control of the mixing and delivery of reactant gases can be provided.

7 Claims, 5 Drawing Sheets

U.S. PATENT DOCUMENTS

| | | | |
|---|---|---|---|
| 6,090,211 A | 7/2000 | Kamei | |
| 6,110,556 A * | 8/2000 | Bang et al. | 428/64.1 |
| 6,113,705 A | 9/2000 | Ohashi et al. | |
| 6,113,984 A | 9/2000 | MacLeish et al. | |
| 6,143,077 A | 11/2000 | Ikeda et al. | |
| 6,165,311 A | 12/2000 | Collins et al. | |
| 6,197,121 B1 | 3/2001 | Gurary et al. | |
| 6,302,964 B1 * | 10/2001 | Umotoy et al. | 118/715 |
| 6,348,099 B1 | 2/2002 | Xia | |
| 6,465,043 B1 | 10/2002 | Gupta | |
| 6,591,850 B2 | 7/2003 | Rocha-Alvarez | |
| 6,630,053 B2 | 10/2003 | Yamagishi | |
| 6,764,546 B2 | 7/2004 | Raaijmakers | |
| 6,812,157 B1 | 11/2004 | Gadgil | |
| 6,843,882 B2 | 1/2005 | Janakiraman et al. | |
| 6,980,204 B1 | 12/2005 | Hawkins | |
| 2001/0007244 A1 | 7/2001 | Matsuse | |
| 2002/0054745 A1 | 5/2002 | Van de Walle et al. | |
| 2003/0005886 A1 | 1/2003 | Park et al. | |
| 2003/0005958 A1 | 1/2003 | Rocha-Alvarez et al. | |
| 2003/0094903 A1 | 5/2003 | Tao et al. | |
| 2003/0133854 A1 | 7/2003 | Tabata et al. | |
| 2003/0213436 A1 | 11/2003 | Kwon | |
| 2003/0221624 A1 | 12/2003 | Jurgensen | |
| 2004/0089235 A1 | 5/2004 | Yamada | |
| 2004/0099213 A1 | 5/2004 | Adomaitis et al. | |
| 2004/0216668 A1 | 11/2004 | Lindfors et al. | |
| 2005/0003600 A1 * | 1/2005 | Kasai et al. | 438/200 |
| 2005/0011436 A1 | 1/2005 | Liu | |
| 2006/0021574 A1 * | 2/2006 | Armour et al. | 118/715 |
| 2006/0180275 A1 * | 8/2006 | Steger | 156/345.34 |
| 2008/0057197 A1 | 3/2008 | Liu | |
| 2008/0202688 A1 * | 8/2008 | Wu et al. | 156/345.34 |

FOREIGN PATENT DOCUMENTS

| | | |
|---|---|---|
| JP | 03-263818 | 11/1991 |
| JP | 1992-209794 | 7/1992 |
| JP | 1995-111244 | 1/1995 |
| JP | 07-111244 | 4/1995 |
| JP | 1998-12554 | 1/1998 |
| JP | 1998-158843 | 6/1998 |
| JP | 2002-110567 | 4/2002 |
| JP | 2003-309075 | 10/2003 |
| WO | WO 92/05577 | 4/1992 |
| WO | WO 99/36587 | 7/1999 |
| WO | 0218672 A1 | 3/2002 |
| WO | WO 2005/010227 | 2/2005 |

OTHER PUBLICATIONS

Woelk, "Metalorganic Vapor Phase Epitaxy for Specialty Semiconductor Devices", Source Unknown, Date of publication predates date of application.

U.S. Appl. No. 10/621,049, filed Jul. 15, 2003, Liu, Heng.

U.S. Appl. No. 12/259,787, filed Oct. 28, 2008, Moshtag, et al.

Aixtron of Germany, "Planetary Reactor" Source Unknow, Date of publication predates date of application filing.

H. Jürgensen et al, "MOCVD Equipment for Recent Developments Towards the Blue and Green Solid State Laser", MRS Internet Journal of Nitride Semiconductor Research, vol. 1, Article 26, published 1996.

J. Dai "Atmospheric pressure MOCVD Growth of high-quality ZnO films on Al O templates", Journal of Crystal Growth 283 (2005), pp. 93-99.

Theodoropoulos et al. "Design of gas inlets for the growth of gallium nitride by metalorganic vapor phase epitaxy", Journal of Crystal Growth217 (200), pp. 65-81.

Thomas Swan, "CVD Reactor", Source Unknown, Date of publication predates date of application filing.

U.S. Appl. No. 11/064,984, filed Feb. 23, 2005, Heng Liu.

U.S. Appl. No. 11/932,293, filed Oct. 31, 2007, Heng Liu.

U.S. Appl. No. 11/740,736, filed Apr. 26, 2007, Heng Liu.

U.S. Appl. No. 10/727,746, filed Dec. 3, 2003, Heng Liu.

U.S. Appl. No. 12/273,943, filed Nov. 19, 2008, Heng Liu.

U.S. Appl. No. 12/058,380, filed Mar. 28, 2008, Vahid S. Moshtagh et al.

U.S. Appl. No. 12/259,787, filed Oct. 28, 2008, Vahid S. Moshtagh et al.

* cited by examiner

DRILLED CVD SHOWER HEAD

PRIORITY CLAIM AND RELATED APPLICATION

This patent application claims the benefit of the priority date of U.S. provisional patent application Ser. No. 61/040,399, filed on 28 Mar. 2008 and entitled GUN DRILLED CVD SHOWER HEAD pursuant to 35 USC 119. The entire contents of this provisional patent application are hereby expressly incorporated by reference.

This patent application is a continuation-in-part (CIP) patent application of U.S. patent application Ser. No. 12/058,380, filed 28 Mar. 2008 and entitled BRAZED CVD SHOWER HEAD. The entire contents of this regular patent application are hereby expressly incorporated by reference.

TECHNICAL FIELD

The present invention relates generally to chemical vapor deposition (CVD). The present invention relates more particularly to a shower head for a chemical vapor deposition chamber, wherein the shower head has a plurality of horizontal bores formed therethrough, such as by gun drilling, so as to facilitate enhanced temperature uniformity of the shower head and so as to facilitate enhanced mixing and delivery of reactant gases.

BACKGROUND

The use of chemical vapor deposition (CVD) for fabricating light emitting diodes (LEDs) is well known. Chemical vapor deposition is performed in a chamber. Wafers are placed upon a susceptor within the chamber. A vacuum is formed in the chamber. The susceptor rotates the wafers as reactant gases are injected into the chamber.

The reactant gases are applied to the wafers so as to form desired layers of material upon the wafers. Using chemical vapor deposition, layers of positively doped semiconductor and layers of negatively doped semiconductor can be formed upon wafers in a manner that defines the active region of LEDs. Other layers, such as conductive layers, insulator layers, and passivation layers, can also be formed.

The reactant gases can be applied to the wafers via a shower head that is disposed above the susceptor. It is desirable that the reactant gases be applied uniformly across a wafer so as to facilitate the deposition of uniform (in thickness and composition) layers of material upon the wafer. The uniformity with which reactant gases are applied to a wafer depends, at least in part, upon the uniformity of the temperature of the shower head, particularly the lower surface and injectors thereof.

In view of the foregoing, it is desirable to provide a method and system for facilitating enhanced control of reactant gases that are injected into a chemical vapor deposition chamber.

BRIEF SUMMARY

Systems and methods are disclosed herein to provide enhanced control of reactant gases in a chemical vapor deposition (CVD) chamber. In accordance with an example of an embodiment, reactant gases can be better mixed and controlled by more closely positioning injectors for different gases and/or concentrations of gases with respect to one another and by maintaining a more uniform temperature of the lower surface and injectors of the shower head.

More particularly, in accordance with an example of an embodiment a shower head for a chemical vapor deposition chamber can comprise a plurality of first injectors for a first reactant gas and a plurality of second injectors for a second reactant gas. The first and second reactant gases can have different compositions (can contain different materials) and/or concentrations with respect to one another.

The first and second injectors can be interspersed among one another so as to enhance control of the mixing and delivery of reactant gases within the chemical deposition chamber. By interspersing the first and second injectors among one another, reactions between gases injected thereby, as well as the delivery of materials to the wafers, can be better controlled. By enhancing such control of the mixing and delivery of reactant gases within the chemical vapor deposition chamber, enhanced uniformity of material deposition upon the wafers can be achieved.

In accordance with an example of an embodiment, a more uniform temperature of the shower head can be provided by water cooling the shower head. More particularly, the shower head can comprise a cooling water manifold for distributing cooling water and a plurality of substantially horizontal bores in fluid communication with the cooling water manifold for communicating water through the shower head so as to cool the shower head. Optionally, the shower head can further comprise a reactant gas manifold for distributing reactant gas, and a plurality of substantially horizontal bores in fluid communication with the reactant gas manifold for distributing reactant gas to a plurality of injectors. The injectors to which reactant gas is distributed from the horizontal bores can be interspersed with injectors that receive reactant gas directly, e.g., via vertical bores.

By more uniformly maintaining the temperature of the shower head, particularly the lower surface and injectors thereof, enhanced uniformity of material deposition upon wafers can be achieved. Cooling the shower head also inhibits heat damage thereto that can result in damage to the chamber and/or wafers within the chamber.

In accordance with an example of an embodiment, a method of forming a shower head for a chemical vapor deposition chamber can comprise providing a plate, forming a cooling water manifold in the plate for distributing cooling water, and forming a plurality of substantially horizontal bores in fluid communication with the cooling water manifold for distributing cooling water through the plate so as to cool the shower head. Optionally, the method can further comprise forming a reactant gas manifold in the plate for distributing reactant gas, forming a plurality of substantially horizontal bores in fluid communication with the reactant gas manifold for distributing reactant gas through the plate, and forming a plurality of injectors in fluid communication with the plurality of bores that distribute the reactant gas.

In accordance with an example of an embodiment, a shower head for a chemical vapor deposition chamber can comprise a plate, a manifold formed in the plate, and a plurality of bores, e.g., substantially horizontal bores, in fluid communication with the manifold for distributing water through the plate so as to cool the shower head.

In accordance with an example of an embodiment, a shower head for a chemical vapor deposition chamber can comprise a plate, a manifold formed in the plate, and a plurality of bores, e.g., substantially horizontal bores, in fluid communication with the manifold for distributing reactant gas through the plate to a plurality of injectors.

In accordance with an example of an embodiment, a chemical vapor deposition chamber can comprise a susceptor and a shower head disposed proximate the susceptor. The shower head can comprise a cooling water manifold for distributing cooling water and a plurality of substantially horizontal bores in fluid communication with the cooling water manifold for distributing cooling water through the shower head so as to cool the shower head. Optionally, the shower head can further comprise a reactant gas manifold for distributing reactant gas, and a plurality of reactant gas substantially horizontal bores in fluid communication with the reactant gas manifold for distributing reactant gas to a plurality of injectors.

In accordance with an example of an embodiment, a method for cooling a shower head of a chemical vapor deposition chamber can comprise communicating water from a manifold formed in a channel of a lid of the chemical vapor deposition chamber through a plurality of bores, e.g., gun drilled bores formed in the lid.

In accordance with an example of an embodiment, a method for distributing reactant gas in a shower head of a chemical vapor deposition chamber can comprise communicating reactant gas from a manifold formed in a channel of a lid of the chemical vapor deposition chamber and through a plurality of bores, e.g., gun drilled bores, formed in the lid.

In accordance with an example of an embodiment, a shower head for a chemical vapor deposition chamber can comprise a plate, a plurality of cooling water bores extending through the plate, and a plurality of gas deliver bores extending through the plate. The cooling water bores and the reactant gas bores can be formed such that they do not intersect one another and thus do not leak into one another. For example, the cooling water bores and the reactant gas bores can be formed on different levels, e.g., at different heights within the shower head.

This invention will be more fully understood in conjunction with the following detailed description taken together with the following drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Metal organic chemical vapor deposition (MOCVD) reactors can be used to deposit one or more layers of gallium nitride (GaN) on sapphire wafers. In a MOCVD reactor, sapphire wafers can be placed on a susceptor. The susceptor can be rotated, such as by a shaft mounted to center of susceptor. Reactant gases can be injected into the reactor by injectors formed in or upon a shower head.

The susceptor can be heated to a temperature of approximately 1000° C. Such heating can be required so as to facilitate the desired chemical processes during chemical vapor deposition. According to an aspect of an embodiment, the inside surface of the shower head can be maintained at a temperature of less than 200° C. To keep the surface of the shower head cool, water cooling can be provided to the shower head. Thus, the susceptor assembly can be installed inside a water cooled process chamber.

The process chamber can have an openable top and open bottom. The bottom of the process chamber can be mounted to an exhaust port. The top of the process chamber can be covered by a shower head. The shower head can define a lid for the process chamber. The process chamber, including the bottom exhaust port and top shower head injector, can be capable of maintaining a vacuum. The shower head can be at a close distance to the 1000° C. susceptor. The shower head injector surface facing the susceptor can have thousands of holes where reactant gases can be injected onto the susceptor and wafers.

According to an example of an embodiment, water cooling and the injection of reactant gases is performed at the lower surface of shower head. This can be accomplished by using a gun drilled shower head that has bores formed therein. Cooling water and/or reactant gases can flow through such bores. The use of such bores facilitates the use of injectors for different reactant gases and/or different concentrations of reactant gases wherein the injectors can be intimately positioned among one another.

Thus, a shower head for a chemical vapor deposition chamber can comprise a plurality of first injectors for a first reactant gas and a plurality of second injectors for a second reactant gas. The first and second injectors can be interspersed among one another so as to enhance control of the mixing and delivery of reactant gases within the chemical deposition chamber. Injectors for any desired number of such gases and/or concentrations of gases can be so interspersed.

Such interspersion of the injectors can be achieved by gun drilling the shower head. As those skilled in the art will appreciate, gun drilling can comprise Electric Discharge Machining (EDM) or any other method suitable for forming the bores, holes, openings, and/or apertures discussed herein.

In accordance with an example of an embodiment, a shower head for a chemical vapor deposition chamber can comprise a plurality of first injectors for a first reactant gas, and a plurality of second injectors for a second reactant gas. The first and second injectors can be interspersed among one another.

In accordance with an example of an embodiment, a shower head for a chemical vapor deposition chamber can comprise a cooling water manifold for distributing cooling water and a plurality of substantially horizontal cooling water bores in fluid communication with the cooling water manifold for distributing cooling water through the shower head so as to cool the shower head. In combination with the water cooling manifold/bores or alternatively with respect thereto, the shower head can comprise a reactant gas manifold for distributing reactant gas and a plurality of substantially horizontal reactant gas bores in fluid communication with the reactant gas manifold for distributing reactant gas to a plurality of injectors.

The shower head can be at least partially defined by a plate. The plate can at least partially define a cover or lid of a chemical vapor deposition chamber. The cooling water and/or reactant gas manifolds can be formed in the plate. For example, the cooling water and/or reactant gas manifolds can be defined by channels that are machined in the plate. The cooling water and/or reactant gas manifolds can be machined in the plate by milling or by any other desired method.

Cooling water bores can be formed in the plate such that the cooling water bores are in fluid communication with the cooling water manifold. Thus, cooling water can flow from the cooling water manifold into the cooling water bores. The cooling water bores can extend substantially throughout the plate so as to facilitate water cooling of the shower head. For example, cooling water bores can extend proximate the lower surface of the shower head and proximate the injectors to facilitate water cooling of the lower surface of the shower head and so as to facilitate water cooling of the injectors.

Reactant gas bores can be formed in the plate such that the reactant gas bores are in fluid communication with the reactant gas manifold. Thus, reactant gas can flow from the reactant gas manifold into the reactant gas bores. Injectors which are provided reactant gas via the reactant gas bores can be positioned at any desired location. For example, such injectors can be interspersed with other injectors.

The shower head can be part of a lid for a chemical vapor deposition chamber. Thus, the shower head can be configured to facilitate the formation of a vacuum within the chamber. That is, the shower head or lid can have sufficient structural strength to resist deformation due to ambient pressure when a vacuum is formed within the chemical vapor deposition chamber and the shower head or lid can seal to the body of the chamber so as to inhibit the leakage of ambient air thereinto. Cooling the shower head inhibits deformation of the lid that may cause such leakage.

The shower head can comprise stainless steel. Alternatively, the shower head can comprise steel, aluminum, magnesium, ceramic, composite, or other materials. The shower head can comprise any desired material or combination of materials.

One or more partitions can define a plurality of zones. The zones can separate reactant gases prior to the reactant gases entering the chemical vapor deposition chamber. In this manner, the zones can facilitate the introduction of different reactant gases and/or different concentrations of reactant gases into the chemical vapor deposition chamber at different locations, e.g., upon different portions of the susceptor. Thus, enhanced control of the mixing and/or delivery of reactant gases can be provided.

The zones can be defined by concentric, generally circular, partitions. The zones can be of any desired shape or configuration. For example, the zones can be generally oval, square, rectangular, triangular, or any desired combination thereof.

The partitions can be formed integrally with the plate. For example, the partitions can be formed by machining the plate. The partitions can be machined into the plate by milling.

Figure 1:
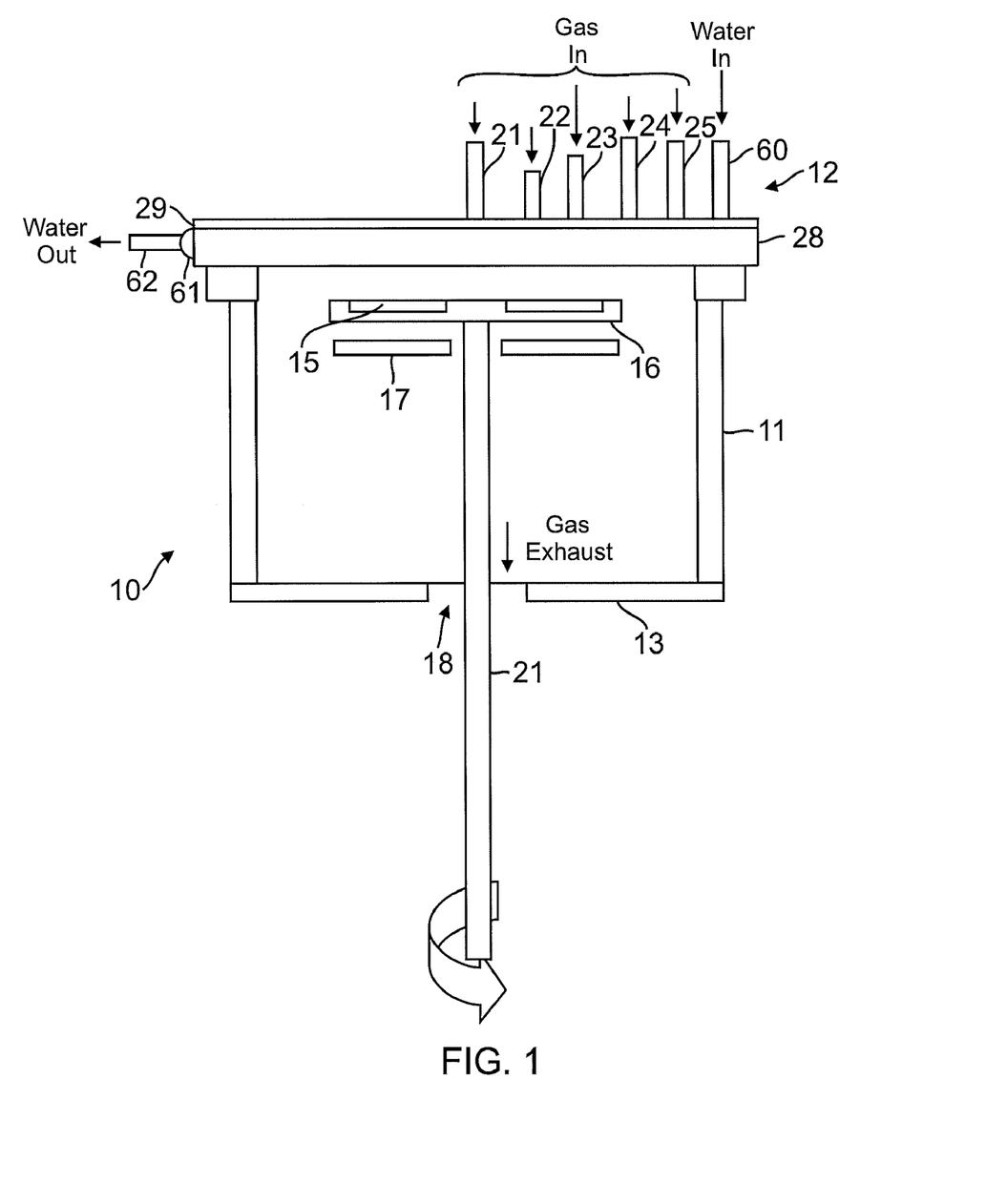
FIG. 1 is a semi-schematic, cross-sectional, side view of a chemical vapor deposition (CVD) reactor having a gun drilled shower head, according to an example of an embodiment.

Referring now to FIG. 1, a chemical vapor deposition reactor 10 can comprise a generally cylindrical wall 11, a base plate 13, and a lid that is defined by a shower head 12. A susceptor 16 can be rotatably disposed proximate the shower head 12. A rotatable shaft 21 can facilitate rotation of the susceptor 16.

The shower head 12 can define a lid for the chemical vapor deposition chamber 10 that provides a substantially airtight seal to the wall 11 of the chemical vapor deposition chamber 10. This seal must generally be maintained throughout the chemical vapor deposition process.

The susceptor 16 can support a plurality of wafers 15 thereon. The wafers 15 can be moved, e.g., rotated, beneath the shower head 12 so as to facilitate the formation of desired materials thereon according to the chemical vapor deposition process. In this manner, light emitting diodes (LEDs) can be fabricated.

Heaters 17 heat the susceptor 16 so as to facilitate the chemical vapor deposition process. The susceptor 16 can be heated to a temperature that necessitates cooling of the shower head 12. For example, the susceptor 16 can be heated to a temperature of approximately 1000° C., while the inside surface of shower head can be maintained at a temperature of less than 200° C.

Cooling water can be provided to the shower head 12 via a water inlet tube 60. The cooling water can exit the shower head 12 via water outlet manifold 61 and water outlet tube 62. The cooling water cools the shower head 12, particularly the lower portion thereof, so as to mitigate heat damage thereto, as discussed herein.

Figure 5:
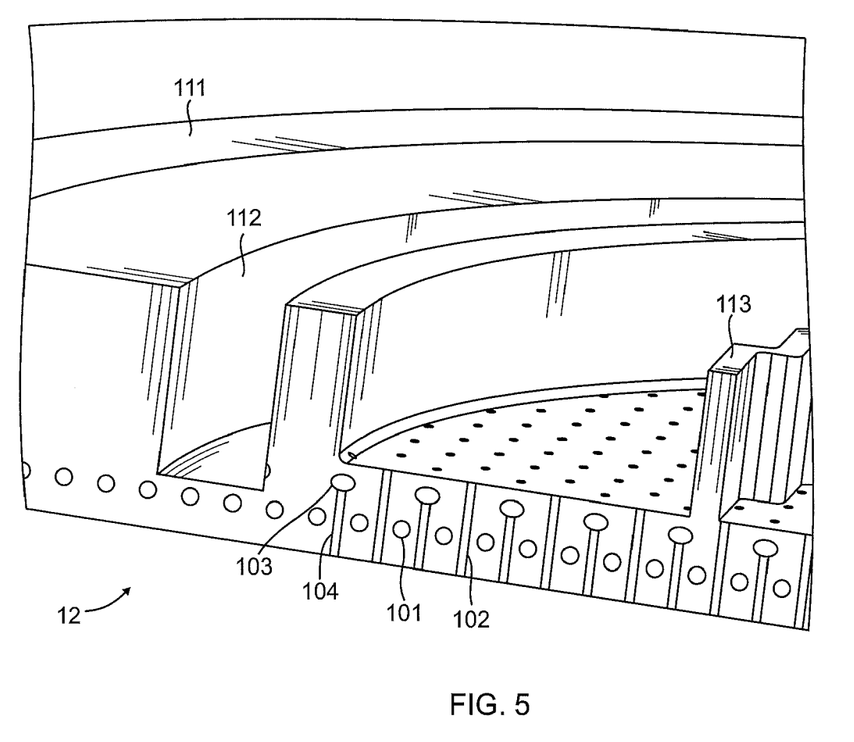
FIG. 5 is a semi-schematic, enlarged, perspective, cross-sectional top view of a shower head for a chemical vapor deposition chamber having gun drilled bores so as to facilitate enhanced cooling of the shower head and enhanced control of reactant mixing and delivery, according to an example of an embodiment.

Reactant gases enter the shower head 12 via gas inlet tubes 21-25. The reactant gases can be maintained separate from one another within the shower head 12 via the use of partitions 113-115 (FIG. 3) and gas manifold 112 (FIG. 3), as discussed below. The reactant gases can be injected into the chemical vapor deposition chamber 10 by injectors 102 and 104 (FIG. 5). Depleted reactant gases exit the chemical vapor deposition chamber 10 via gas exhaust 18 at the bottom of the vapor deposition chamber 10.

According to an aspect, the shower head 12 can comprise a plate 28 to which an outside cover 29 is attached. The outside cover 29 can be attached to the plate 28 by brazing, for example. The outside cover 29 can cooperate with the plate 28 to form channels or manifolds for reactant gas and/or cooling water, as discussed herein.

Figure 2:
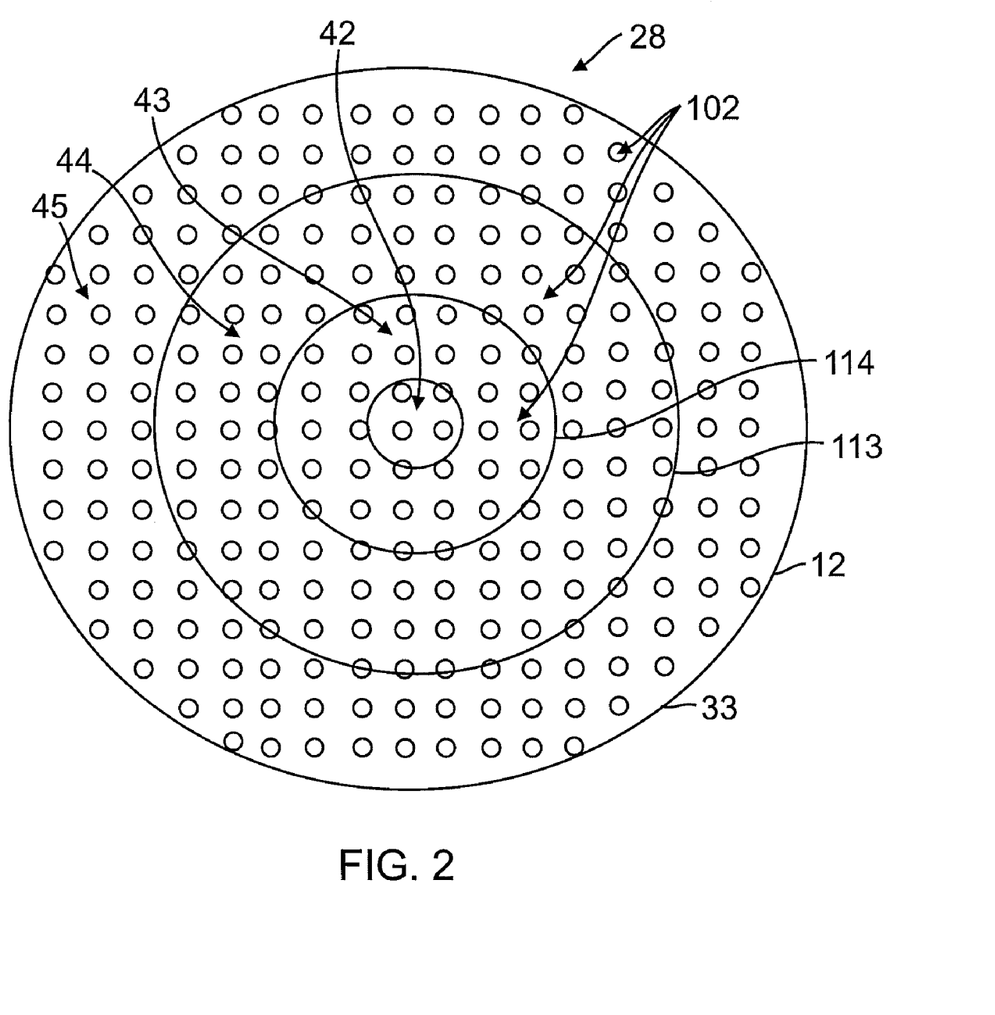
FIG. 2 is a semi-schematic, bottom view of a shower head of a chemical vapor deposition chamber, showing injectors thereof grouped into zones, according to an example of an embodiment.

Referring now to FIG. 2, the zones 42-45 and injectors 102 are shown schematically from the bottom of the shower head 28. The partitions 113-115 (FIG. 3) or the like can be used to define two or more zones 42-45. Each zone 42-45 can facilitate the injection of different reactant gases and/or different concentrations of reactant gases into the chemical vapor deposition chamber 10. The use of such zones 42-45 can enhance control of the injection of reactant gases into the chemical vapor deposition chamber 10.

Injectors 104 (not shown in FIG. 2), which receive reactant gas from a reactant gas manifold as discussed below, can optionally be interspersed or otherwise positioned with respect to injectors 102. Thus, the shower head 12 can be configured such that injectors 104 inject reactant gas into any desired zone or combination of zones. For example, injectors 104 can inject reactant gas into all of the zones 42-45.

Figure 3:
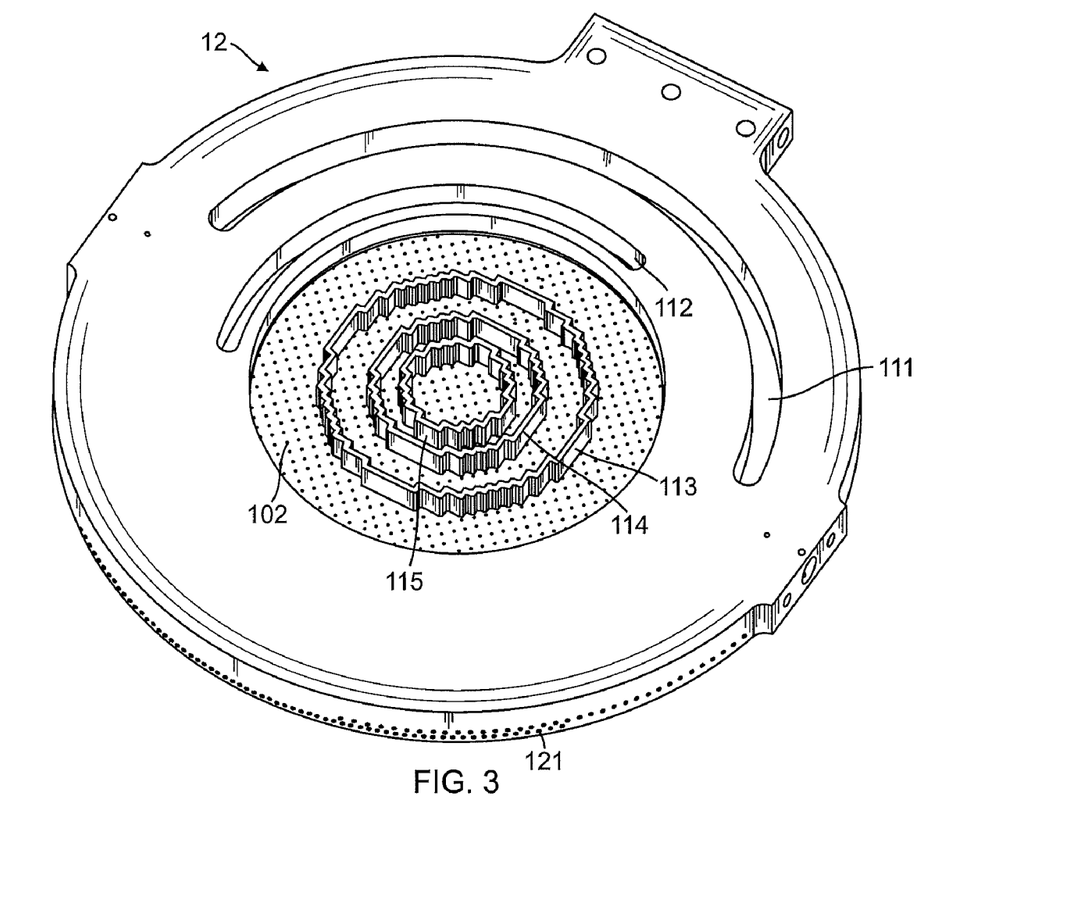
FIG. 3 is a semi-schematic, perspective, top view of a shower head for a chemical vapor deposition chamber having gun drilled bores formed therein so as to facilitate enhanced cooling of the shower head and enhanced control of reactant gas mixing and delivery, according to an example of an embodiment.
Figure 4:
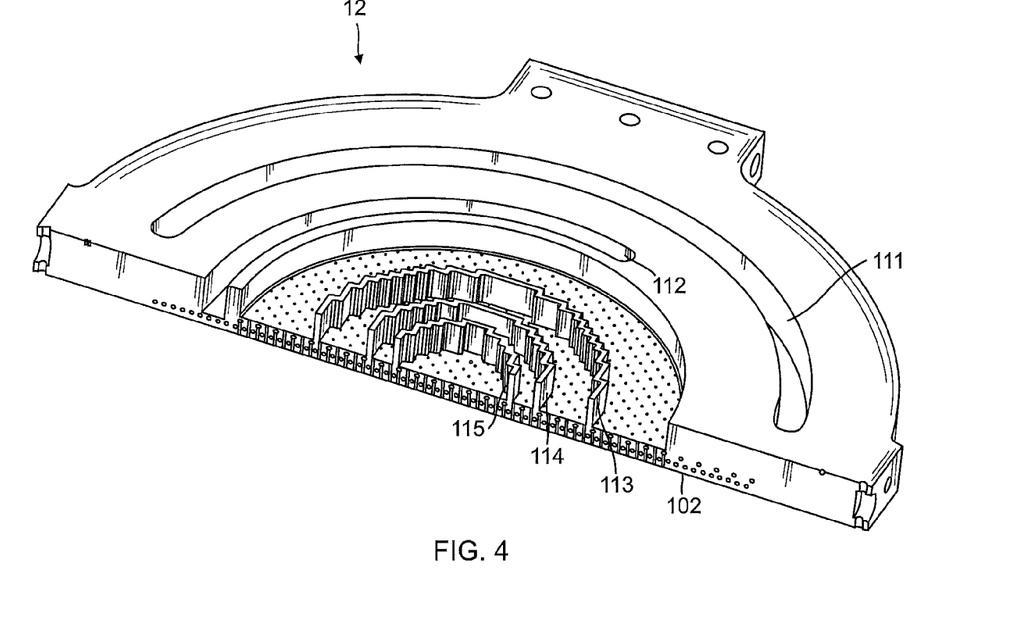
FIG. 4 is a semi-schematic, perspective, cross-sectional top view of a shower head of a chemical vapor deposition chamber having gun drilled bores so as to facilitate enhanced cooling of the shower head and enhanced control of reactant gas mixing and delivery, according to an example of an embodiment.

Referring now to FIGS. 3-5, the shower head 12 can be defined by a generally circular stainless steel plate that sits atop and seals the chemical vapor deposition chamber 10. There can be generally vertical through holes or injectors 102 that are formed by drilling through the shower head 12 (such as from top to bottom) to facilitate reactant gas flow into the chemical vapor deposition chamber 10. Each injector 102 can provide reactant gas to a particular zone 42-45 (FIG. 2).

There can be generally horizontal bores 101 and 103 formed by drilling (such as by gun drilling or Electronic Discharge Machining (EDM)), to facilitate water cooling of the shower head 12 and/or reactant gas flow into the chemical vapor deposition chamber 10. Generally horizontal bores 101 can facilitate water cooling of the shower head 12. Generally horizontal bores 103 can provide reactant gas to injectors 104.

A cooling water manifold 111 and/or a reactant gas manifold 112 can be formed in the shower head 12, such as by machining, e.g., milling, the shower head 12. For example, a generally arcuate water manifold 111 can be formed closer to the periphery of the shower head 12 than a generally arcuate gas manifold 112. The cooling water manifold 111 can be deeper than the gas manifold 112. Cooling water bores 101 can be in fluid communication with the water manifold 111. Reactant gas bores 103 can be in fluid communication with the reactant gas manifold 112.

Configuring the cooling water manifold 111 such that it is deeper than the reactant gas manifold 112 allows the cooling water bores 101 to be positioned beneath the reactant gas bores 103 such that the cooling water bores 101 and the reactant gas bores 103 do not intersect (and thus leak into one another). Positioning the cooling water bores 101 beneath the reactant gas bores 103 facilitates positioning of the cooling water bores closer to the bottom surface of the shower head 12, where cooling is needed.

Partitions 113, 114, and 115 define zones 42-45 (FIG. 2) such that different reactant gases and/or concentrations of reactant gases can be provided to the chemical vapor deposition chamber 10 at different locations therein, e.g., at different distances from the center of the susceptor 16. In this manner, distribution of the reactant gases within the chamber, i.e., above the susceptor 16, can be better controlled.

For example, reactant gas flowing into the chemical vapor deposition chamber 10 via gas inlet tube 21 can enter zone 42 (FIG. 2) from which the reactant gas is injected into the chemical vapor deposition chamber 10 by injectors 102. Similarly, reactant gas flowing into the chemical vapor deposition chamber 10 via gas inlet tube 22 can enter zone 43 (FIG. 2) from which the reactant gas is injected into the chemical vapor deposition chamber 10 by injectors 102. Similarly, reactant gas flowing into the chemical vapor deposition chamber 10 via gas inlet tube 23 can enter zone 44 (FIG. 2) from which the reactant gas is injected into the chemical vapor deposition chamber 10 by injectors 102. Similarly, reactant gas flowing into the chemical vapor deposition chamber 10 via gas inlet tube 24 can enter zone 45 (FIG. 2) from which the reactant gas is injected into the chemical vapor deposition chamber 10 by injectors 102.

Reactant gas entering the chemical vapor deposition chamber 10 via gas inlet tube 25 can enter reactant gas manifold 112 from which the reactant gas flows through reactant gas bores 103 to injectors 104 and is then injected into the chemical vapor deposition chamber 10 by injectors 104. Generally, injectors 104 can be positioned as desired. Thus, injectors 104 can be positioned in any desired zone 42-45 or combination of zones 42-45.

For example, injectors 104 can be interspersed with injectors 102 as best shown in FIG. 5. That is, injectors 104 can be positioned between injectors 102 such that every other injector receives reactant gas from reactant gas inlet 26. Similarly, injectors 104 can be positioned between injectors 102 such that every third, forth or fifth injector receives reactant gas from reactant gas inlet 25. Injectors 104 can be positioned between injectors 102 in any desired configuration.

Reactant gas from reactant gas inlet tubes 21-24 can be injected into the chemical vapor deposition chamber 12 at zones 42-45, respectively. By way of contrast, reactant gas from reactant gas inlet tube 25 can be injected into the chemical vapor deposition chamber 12 by injectors 104 that can be interspersed with injectors 102 and that are not necessarily limited to a particular zone or zones.

Injectors 104 can be interspersed among any selected injectors 102 or among all of the injectors 102, as desired. For example, a shower head 12 can be configured such that reactant gas from reactant gas inlet tube 25 is provided only to zone 42. Similarly, a shower head 12 can be configured such that reactant gas from reactant gas inlet tube 25 is provided only to zone 43, zone 44, or zone 45.

Cooling water can enter the cooling water manifold 111, pass through the cooling water bores 101, and exit the shower head through openings 121 (FIG. 3). Cooling water outlet manifold 61 (FIG. 1) can receive cooling water from openings 121 and carry the cooling water away from the shower head via cooling water outlet tube 62 (FIG. 1). Cooling water outlet manifold 61 can be formed by adding a pipe or channel to the outside periphery of the shower head.

As many sets of manifolds, bores, and injectors can be used to inject as many different reactant gases and/or concentrations of reactant gases as desired. For example, two, three, four, or more reactant gas manifolds and corresponding sets of bores and injectors can be used to inject two, three, four, or more reactant gases and/or concentration of reactant gases.

More than one cooling water manifold and/or sets of generally horizontal water cooling bores can be used, if desired. For example, two or more independent sets of water cooling manifolds and water cooling bores can be used for redundancy or for more effective/efficient cooling.

Any or all of the machining of the shower head 12 can be performed by Electric Discharge Milling (EDM). However, those skilled in the art will appreciate that other methods of machining are likewise suitable.

Cooling the shower head 12 inhibits heat damage thereto. As those skilled in the art will appreciate, such heat damage can compromise the structural integrity of the chemical vapor deposition chamber and can cause air leakage thereinto. Cooling the shower head 12 also tends to make the temperature thereacross more uniform and thus enhances the uniformity of the injection of reactant gases. Due to the low pyrolysis temperatures of the metalorganic chemicals used in the process (as low as 300° C. for the GaN MOCVD process), efficient cooling of the shower head is also required in order to keep the CVD reaction from occurring on the shower head surface.

Embodiments described above illustrate, but do not limit, the invention. It should also be understood that numerous modifications and variations are possible in accordance with the principles of the present invention. Accordingly, the scope of the invention is defined only by the following claims.

The invention claimed is:

1. A shower head for a chemical vapor deposition chamber, the shower head comprising:
   a single plate;
   a plurality of injectors formed in the plate and configured to inject reactant gas into the chemical vapor deposition chamber;
   a reactant gas manifold defined by a channel formed in the plate;
   a plurality of substantially horizontal reactant gas bores formed in the plate, in fluid communication with the reactant gas manifold, and configured to distribute reactant gas to the injectors;
   a water manifold defined by a channel formed in the plate; and a plurality of substantially horizontal water bores formed in the plate, in fluid communication with the water manifold, and configured to distribute water through the shower head to cool the shower head.

2. The shower head as recited in claim 1, wherein the plate at least partially defines a cover of the chemical vapor deposition chamber.

3. The shower head as recited in claim 1, wherein the shower head is configured to facilitate the formation of a vacuum within the chemical vapor deposition chamber.

4. The shower head as recited in claim 1, wherein the shower head is formed of stainless steel.

5. The shower head as recited in claim 1, further comprising at least one partition defining a plurality of zones, the zones separating reactant gases prior to the reactant gases entering the chemical vapor deposition chamber.

6. The shower head as recited in claim 1, further comprising a plurality of concentric, generally circular, partitions defining a plurality of zones, the zones separating reactant gases prior to the reactant gases entering the chemical vapor deposition chamber.

7. The shower head as recited in claim 1, further comprising at least one partition formed integrally with the plate, the partition(s) defining a plurality of zones, the zones separating reactant gases prior to the reactant gases entering the chemical vapor deposition chamber.

\* \* \* \* \*